United States Patent [19]
Vaneman et al.

[11] Patent Number: 4,915,751
[45] Date of Patent: Apr. 10, 1990

[54] ACCELERATED WHISKER GROWTH ON IRON-CHROMIUM-ALUMINUM ALLOY FOIL

[75] Inventors: Gerald L. Vaneman, Grand Ledge; David R. Sigler, Sterling Heights, both of Mich.

[73] Assignee: General Motors Corporation, Detroit, Mich.

[21] Appl. No.: 240,285

[22] Filed: Sep. 6, 1988

[51] Int. Cl.$^4$ ............................................. C23C 11/08
[52] U.S. Cl. ................................. 148/280; 502/439; 148/285
[58] Field of Search ................. 148/280, 285; 502/439

[56] References Cited

U.S. PATENT DOCUMENTS

| | | | |
|---|---|---|---|
| 4,318,828 | 3/1982 | Chapman | 252/465 |
| 4,331,631 | 5/1982 | Chapman et al. | 422/180 |
| 4,414,023 | 11/1983 | Aggen et al. | 75/124 |
| 4,588,449 | 5/1986 | Sigler | 148/6.35 |
| 4,661,169 | 4/1987 | Aggen et al. | 148/2 |

*Primary Examiner*—Sam Silverberg
*Attorney, Agent, or Firm*—Douglas D. Fekete

[57] ABSTRACT

An accelerated method for growing oxide whiskers on aluminum-containing stainless steel foil comprises heating the foil in air at an initial temperature suitably less than 960° C., preferably between 900° C. and 950° C., to initiate whisker growth and thereafter increasing the temperature to above 960° C., preferably between 960° C. and 990° C., to continue whisker growth at an accelerated rate and thereby reduce the time and processing expense required to grow mature whiskers of a desired size.

10 Claims, 5 Drawing Sheets

1 μm

1 μm

ACCELERATED WHISKER GROWTH ON IRON-CHROMIUM-ALUMINUM ALLOY FOIL

BACKGROUND OF THE INVENTION

This invention relates to oxidation of aluminum-containing ferritic stainless steel foil under conditions that form oxide whiskers that substantially cover the foil surface and improve adhesion of an applied coating. More particularly, this invention relates a method for growing the whiskers that comprises heating the foil within a first temperature range to initiate the growth and thereafter within a relatively higher temperature range to continue the growth at an accelerated rate so as to reduce the time required to grow mature whiskers.

A metal monolith automotive catalytic converter typically comprises an aluminum-containing ferritic stainless steel foil substrate that carries an alumina coating impregnated with noble metal catalyst. Suitable iron-base alloys for the substrate comprise, by weight, about 15 to 25 percent chromium and about 3 to 6 percent aluminum. The alloy also may contain up to 1 percent yttrium or up to 0.1 percent rare earth metal, most notably cerium, to enhance high temperature corrosion resistance.

Prior to coating, the foil is oxidized to form a protective oxide layer. U.S. Pat. Nos. 4,331,631 and 4,318,828 describe oxidation treatment of the foil to form an oxide layer characterized by densely spaced whiskers that improve adhesion of the applied coating. The foil may be formed by cold rolling or by a metal peeling process. For cold rolled foil, the foil is pretreated by heating in a low-oxygen atmosphere to form a thin, precursor oxide film suitable for nucleating the whiskers. Although whiskers may be grown on peeled foil without a low-oxygen pretreatment, such pretreatment is nonetheless preferred to assure consistent growth.

To grow the whiskers, the pretreated foil is heated in a readily oxidizing atmosphere such as air for an extended time. In general, whiskers of preferred size and shape for bonding an applied coating are formed by heating at temperatures between 900° C. and 950° C. At higher temperatures, whisker growth tends to be inhibited, most likely by the formation of non-whisker alpha alumina. The particular uppermost whisker-growing temperature is sensitive to alloy composition. For example, a typical commercial cerium-containing alloy is found to be covered by whiskers after treatment at 960° C., but to form few, scattered whiskers when heated at 980° C. On the other hand, it is desired to reduce the treatment time to reduce the cost. Even within the preferred 900° C. to 950° C. growing range, treatment times of eight hours or more have heretofore been required to grow whiskers of a suitable size for tightly bonding the applied coating.

It is an object of this invention to provide an improved treatment for growing oxide whiskers on aluminum-containing ferritic stainless steel foil, which method employs a multi-temperature whisker-forming oxidation treatment to reduce the time required to grow mature whiskers.

SUMMARY OF THE INVENTION

In accordance with a preferred embodiment of this invention, an improved method for growing alumina whiskers on suitably prepared aluminum-containing ferritic stainless steel foil comprises heating in air at a first temperature for a short period sufficient to initiate formation of the whiskers, and thereafter at a second, relatively higher temperature to continue growth into mature whiskers at an accelerated rate. The bare foil, which may be peeled or cold rolled, is preferably pretreated by heating in a low-oxygen atmosphere at between about 875° C. and 925° C. Suitable pretreatment atmosphere contains an oxygen partial pressure not greater than about 1.5 torr, preferably less than 0.75 torr. Only a brief pretreatment is needed to form a blush oxide film suitable for nucleating the whiskers. Thereafter, the pretreated foil is heated in air to commence formation of the whiskers. This initial treatment step is carried out at a temperature less than 960° C. and preferably between about 900° C. and 950° C. This corresponds approximately to the range heretofore preferred for growing the whiskers. However, in accordance with this invention, this initial growth stage is carried out for a shortened period insufficient to form mature whiskers, for example, less than two hours and preferably less than 15 minutes. Thereafter, the temperature is increased to between about 960° C. and 990° C. to continue growth at an accelerated rate. It is found that whiskers initiated at the lower temperature continue growth at the elevated temperature even though above the range suitable for forming whiskers ab initio on pretreated foil. Furthermore, it is found that the higher temperature accelerates the rate at which the whiskers form. Thus, this invention may reduce the time by up to one-half or more that is required to grow mature whiskers of a desired size and shape.

DETAILED DESCRIPTION OF THE INVENTION

This invention is better understood by reference to the following examples.

EXAMPLE 1

A peeled foil was formed of an alloy comprising, by weight, about 19.7 percent chromium, 5.31 percent aluminum, 0.30 percent silicon, 0.28 percent manganese, 0.03 percent carbon, 0.007 percent nitrogen, not greater than 0.002 percent sulfur, less than 0.002 percent magnesium and the balance iron. The foil was made by a metal peeling process as described in U.S. Pat. No. 4,331,631, issued to Chapman et al in 1982 and incorporated herein by reference. The bare foil was pretreated by heating in a vacuum furnace at about 900° C. for about 15 minutes. Prior to heating, the furnace was evacuated to about $7.5 \times 10^{-5}$ torr. The oxygen partial pressure was estimated to be about $1.5 \times 10^{-5}$ torr.

Following the pretreatment, the foil was placed in a furnace having an air atmosphere and heated for one hour at 925° C. and then for three hours at 960° C.

Figure 1:
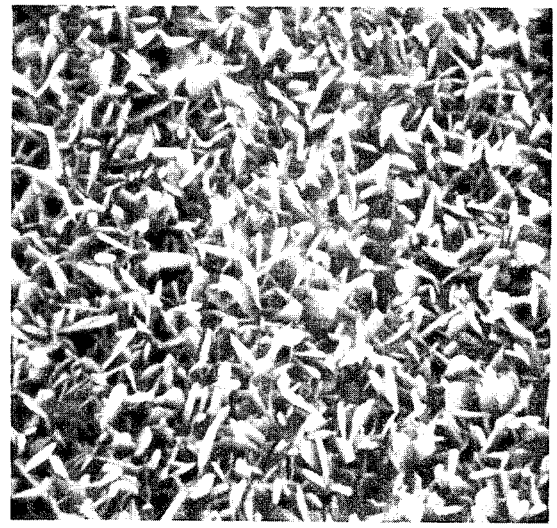
FIGS. 1 through 10 are electron photomicrographs showing oxide layers formed on aluminum-containing ferritic stainless steel foil surfaces oxidized under various conditions set forth in the examples that follow.

The resulting oxide is shown in FIG. 1 and consists of well-developed oxide whiskers randomly oriented and substantially covering the surface. The whiskers are characterized by a high aspect ratio and are effective for bonding an applied ceramic coating.

COMPARATIVE EXAMPLE 1a

Figure 2:
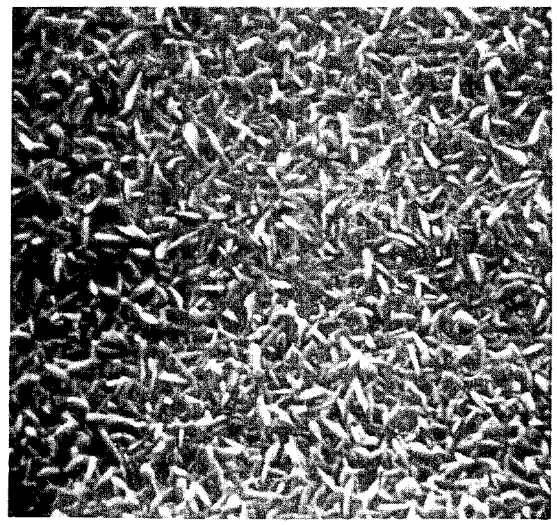

A sample of the peeled foil in Example 1 was pretreated as in Example 1 and thereafter oxidized by heating in air for four hours at 925° C. The resulting oxide is shown in FIG. 2 and comprises whiskers which, in comparison to the whiskers formed in Example 1, are significantly smaller, even though the respective whisker growth treatment were carried out for comparable times.

COMPARATIVE EXAMPLE 1b

Figure 3:
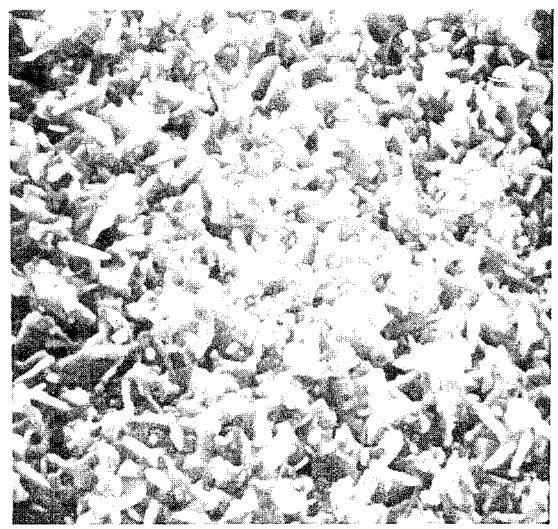

For purposes of further comparison, a second sample of the foil described in Example 1 was pretreated also as in Example 1 and thereafter oxidized by heating in air for four hours at 960° C. The resulting oxide is shown in FIG. 3 and comprises a rough oxide layer having few, scattered whiskers, in marked contrast to the oxide whiskers shown in FIG. 1 that substantially cover the surface. Thus, the method of this invention as set forth in Example 1 was effective to grow whiskers at temperatures that would not normally produce the desired whiskers ab initio.

EXAMPLE 2

Figure 4:

A second sample of the foil described in Example 1 was treated in accordance with this invention to grow whiskers thereon. The sample was pretreated also as in Example 1 and thereafter oxidized in air for two hours at 925° C. and then for two hours at 990° C. The resulting oxide is shown in FIG. 4. The oxide consists of high aspect ratio whiskers that substantially cover the surface to improve bonding of an applied coating.

COMPARATIVE EXAMPLE 2a

Figure 5:
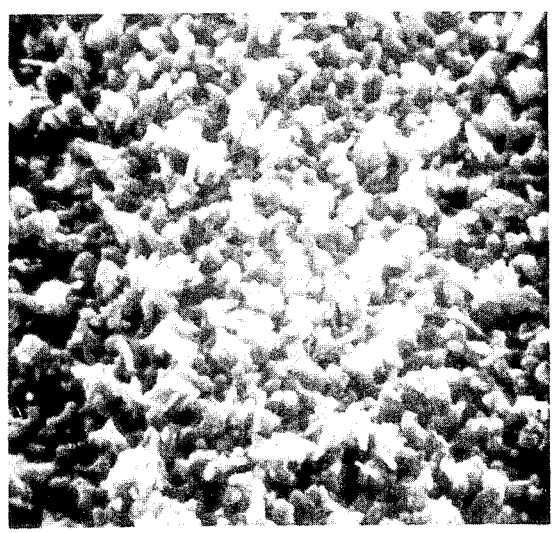

For purpose of comparison, a sample of the foil described in Example 1 was pretreated also as in Example 1 and thereafter heated for four hours at 990° C. The resulting oxide is shown in FIG. 5. The oxide is formed of nodules, in marked contrast to the dense whisker growth formed in Example 2. Thus, this invention as shown in Example 2 grew whiskers at temperatures above the range heretofore considered suitable for such whisker growth.

EXAMPLE 3

Figure 6:
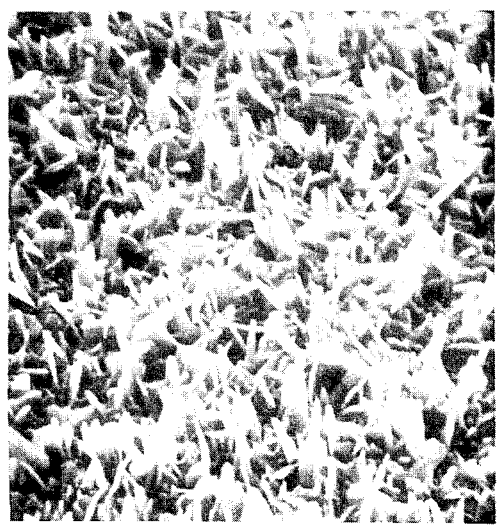

A sample of the foil described in Example 1 was pretreated as in Example 1 and thereafter heated in air for one hour at 925° C., then for one hour at 960° C., and finally for two hours at 990° C. The resulting oxide is shown in FIG. 6 and comprises mature, high aspect ratio oxide whiskers that substantially cover the foil surface and are well suited for penetrating an applied coating to improve bonding.

EXAMPLE 4

Figure 7:
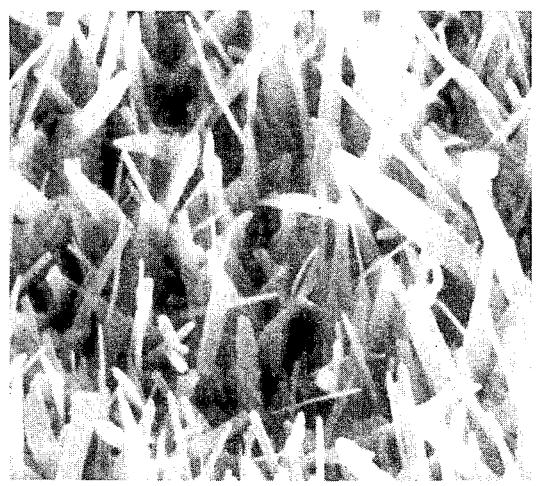

A sample of cold rolled foil was treated in accordance with this invention to accelerate whisker growth. The foil was composed of a alloy comprising, by weight, 20.2 percent chromium, 5.06 percent aluminum, 0.37 percent silicon, 0.12 percent manganese, 0.003 percent sulfur, 0.039 percent cerium, 0.079 percent total rare earth (including cerium) and the balance iron and impurities. The foil was pretreated by heating at 900° C. for 10 seconds in an ambient pressure nitrogen atmosphere containing 100 ppm oxygen. Whiskers were grown by heating the pretreated foil in air for 15 minutes at 915° C. and thereafter for 3.75 hours at 965° C. The resulting oxide is shown in FIG. 7 and comprises mature, high aspect ratio oxide whiskers that substantially cover the foil surface. For purposes of comparison, comparable whisker growth was obtained by heating similarly pretreated foil at 940° C. for eight hours. Thus, the dual temperature treatment of this invention was estimated to accelerate whisker growth by a factor of about two.

EXAMPLE 5

Figure 8:
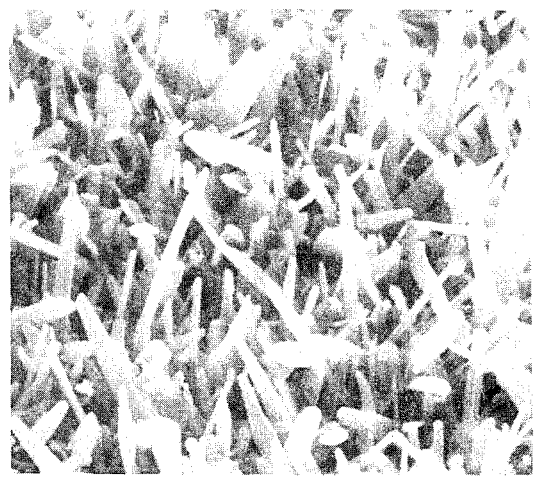

A sample of the cold-rolled foil described in Example 4 was treated in accordance with this invention to accelerate whisker growth thereon. The foil was pretreated as in Example 4 and thereafter oxidized in air at 940° C. for 15 minutes and thereafter at 985° C. for 3.75 hours. The resulting oxide is shown in FIG. 8 and comprises mature, high aspect ratio whiskers substantially covering the surface. For purposes of comparison, a sample of similarly pretreated foil was heated in air at 985° C. for eight hours, but produced few, scattered whiskers.

EXAMPLE 6

Figure 9:
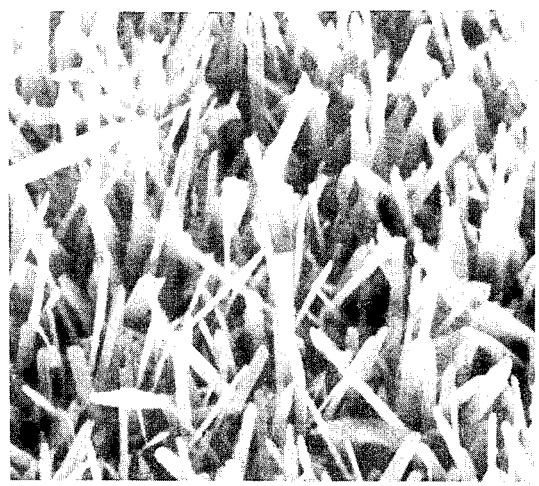

A sample of cold rolled foil of calcium-enriched ferritic stainless steel alloy was treated in accordance with this invention to accelerate whisker growth thereon. The alloy contained, by weight, about 18.7 percent chromium, 5.0 percent aluminum, 0.007 percent sulfur, 0.018 calcium and the balance mainly iron. The sample was pretreated by heating at about 900° C. for 10 seconds in ambient pressure nitrogen atmosphere containing 100 ppm oxygen. The pretreated foil was heated for 15 minutes at 915° C. and thereafter heated in air for 3.75 hours at 965° C. The resulting oxide is shown in FIG. 9 and consisted of an abundance of high aspect ratio oxide whiskers substantially covering the foil surface. For purposes of comparison, a single temperature oxidation treatment carried out on a similarly pretreated sample at 965° C. produced comparable whiskers, but only after about eight hours. Thus, the method of this invention successfully reduced whisker growing time by about one-half.

EXAMPLE 7

Figure 10:
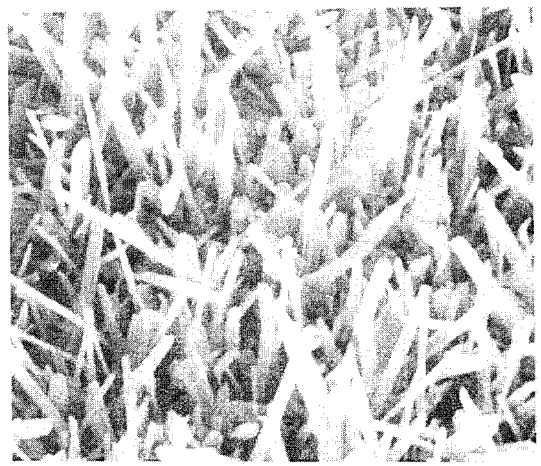

A sample of the foil described in Example 6 was similarly pretreated and subjected to an accelerated whisker growing process in accordance with this invention. The sample was pretreated as in Example 6 and heated in air at 940° C. for about 15 minutes and thereafter at 985° C. for 3.75 hours. The resulting whiskers are shown in FIG. 10. For purposes of comparison, a comparably treated sample was heated at 985° C. for eight hours, but produced few, scattered whiskers, in marked contrast to the abundance of whiskers substantially covering the foil surface when treated in accordance with this invention.

Therefore, the method of this invention accelerates whisker growth on aluminum-containing ferritic stainless steel foil and thereby reduces the time and expense required to treat the foil, for example, to receive an applied coating. The optimum temperature schedule for accelerated whisker growth depends upon several factors including alloy composition. While not limited to any particular theory, it is believed that the whiskers form of a transitional alumina composition composed mainly of delta and theta alumina. It is believed that the formation of this transitional alumina on aluminum-containing ferritic stainless steel is favored between about 900° C. and 950° C. The formation of alpha alumina, which is not suitable for forming whiskers, is favored at higher temperatures and predominates at temperatures above about 1000° C. Thus, as oxidation temperature increases, the tendency to form alpha alumina also increases, reducing whisker formation. For this reason, it has been heretofore common practice to grow whiskers at temperatures less than about 960° C., although the maximum whisker-growing temperature varies depending upon alloy composition and, more particularly, is sensitive to additives that influence oxide formation, such as oxide adherence agents. It has now been found in accordance with this invention that whisker growth initiated within an optimum transitional alumina-forming temperature range may be continued and indeed accelerated at higher temperatures, including temperatures above the range normally suitable for initiating whisker growth. Thus, once whisker growth is initiated within the preferred transitional alumina-forming temperature, it may be suitably continued at higher temperatures up to the temperature whereat transitional alumina tends to transform to alpha alumina, typically about 1000° C.

Thus, whisker growth in accordance with this invention is initiated and carried out at temperatures within distinctive ranges. In a first step, the steel is heated at a temperature suitably up to about 960° C. and preferably between about 900° C. and 950° C. to initiate whisker growth. This initial step may be readily accomplished by heating for about two hours, although longer times are not detrimental to whisker growth. Preferably, whisker growth may be initiated by heating for 15 minutes or less. Thereafter, the temperature is increased to accelerate maturation of the nascent whiskers into whiskers of the desired size. This maturation step may be preferably carried out at temperatures between about 960° C. and 1000° C. Preferably, the oxidation temperature is initially set within the whisker initiation temperature range and progressively increased to temperature within the suitable whisker maturation temperature range. The time required to complete whisker growth is dependent in part upon the size of the desired whiskers. While in the figures large whiskers having high aspect ratios are depicted, those skilled in the art will appreciate that smaller whiskers may be suitable for particular applications. For example, smaller whiskers may be adequate for bonding a ceramic washcoat of the type employed in the manufacture of an automotive catalytic converter and may be formed in a total of about one hour by the method of this invention by a regimen comprising oxidizing for 15 minutes within a suitable whisker initiation temperature range and thereafter oxidizing for the remaining time within a suitable whisker maturation temperature range.

In the Examples, whisker growth was carried out in air. Other suitable readily oxidizing atmospheres may be substituted. Such atmospheres are in marked contrast to the oxygen-starved atmospheres required for the preferred pretreatment. This invention is intended to be carried out on iron-base alloys comprising chromium and aluminum and optionally containing oxide adherence agents such as yttrium and cerium. Preferred alloys comprise, by weight, about 15 to 25 percent chromium and about 3 to 6 percent aluminum. This method is particularly suited for growing whiskers on foil, which foil may be formed either by cold rolling or by a metal peeling process. For cold rolled foil, a low oxygen pretreatment is necessary to form a precursor oxide suitable for nucleating whisker formation. Suitable pretreatments are described in U.S. Pat. No. 4,318,828, incorporated herein by reference. In the above examples, pretreatment was carried out either in a vacuum comprising a suitably low residual oxygen partial pressure or in a nitrogen atmosphere containing a controlled oxygen addition. Another example of a suitable pretreatment comprises heating in a carbon dioxide atmosphere, which dissociates to produce reactive oxygen in amounts suitable for pretreatment. Although pretreatment is not necessary for foil formed by a metal peeling process, it is nevertheless preferred to assure reliable and consistent whisker growth.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

1. An accelerated method for growing oxide whiskers on an aluminum-containing ferritic stainless steel foil formed by a metal peeling process and containing chromium and between about 3 and 6 percent by weight aluminum; said method comprising heating the surface absent any precursor oxide film in readily oxidizing atmosphere at an initial temperature between about 900° C. and 960° C. for a time less than about two hours to initiate whisker growth and thereafter at a relatively higher temperature between about 960° C. and 1000° to continue whisker growth for a time sufficient to grow mature whiskers of a desired size.

2. The method according to claim 1 wherein the steel further comprises, by weight, between about 15 and 25 percent chromium and an oxide adhesion agent selected from the group consisting of yttrium and rare earth metals.

3. An accelerated method for growing oxide whiskers on a foil composed of an iron-base alloy containing chromium and between about 3 and 6 percent by weight aluminum, said method comprising
pretreating the foil by heating to form a whisker precursor oxide film, and
heating the pretreated foil while exposed to a readily oxidizing atmosphere to grow oxide whiskers that substantially cover the foil surface, said heating being carried out at an initial temperature between about 900° C. and 960° C. for a time less than about two hours and thereafter at a relatively higher temperature between about 960° C. and 1000° C. to grow the desired mature whiskers.

4. An accelerated method for growing oxide whiskers on a foil composed of an iron-base alloy comprising, by weight, between about 15 and 25 percent chromium and 3 and 6 percent aluminum, said method comprising
pretreating the foil by heating while exposed to an atmosphere containing oxygen in an amount not greater than 0.75 torr partial pressure to form a whisker precursor oxide film, and
heating the pretreated foil while exposed to air to grow high aspect ratio oxide whiskers that substantially cover the foil surface, said heating being carried out at an initial temperature between about 900° C. and 950° C. for a time less than about 15 minutes and thereafter at a relatively higher temperature between about 960° C. and 990° C. to grow the desired mature whiskers.

5. The method according to claim 3 wherein the alloy contains about 15 and 25 percent by weight chromium.

6. The method according to claims 3 or 4 wherein the foil is cold-rolled foil.

7. The method according to claim 3 or 4 wherein the foil is formed by a metal peeling process.

8. The method according to claims 3 or 4 wherein the total time that the foil is heated to grow the whiskers does not exceed about four hours.

9. The method according to claims 3 or 4 wherein the temperature whereat the foil is heated to grow the whiskers is progressively increased from a temperature within said initial temperature range to a temperature within said relatively higher temperature range.

10. The method according to claims 4 or 5 wherein the alloy further comprises an oxide adhesion agent selected from the group consisting of yttrium and rare earth metals.

* * * * *